(12) United States Patent
Hammersberg et al.

(10) Patent No.: US 12,008,835 B2
(45) Date of Patent: Jun. 11, 2024

(54) BIOMETRIC IMAGING ARRANGEMENT FOR INFRARED IMAGING COMPRISING A WAVEGUIDE FORMED ON AN IMAGE SENSOR

(71) Applicant: Fingerprint Cards Anacatum IP AB, Gothenburg (SE)

(72) Inventors: Johan Hammersberg, Floda (SE); Pontus Jägemalm, Lerum (SE)

(73) Assignee: Fingerprint Cards Anacatum IP AB, Gothenburg (SE)

( * ) Notice: Subject to any disclaimer, the term of this patent is extended or adjusted under 35 U.S.C. 154(b) by 0 days.

(21) Appl. No.: 18/028,912

(22) PCT Filed: Sep. 29, 2021

(86) PCT No.: PCT/SE2021/050958
§ 371 (c)(1),
(2) Date: Mar. 28, 2023

(87) PCT Pub. No.: WO2022/071861
PCT Pub. Date: Apr. 7, 2022

(65) Prior Publication Data
US 2023/0334896 A1    Oct. 19, 2023

(30) Foreign Application Priority Data
Oct. 1, 2020    (SE) .................... 2051141-6

(51) Int. Cl.
*G06K 9/00*    (2022.01)
*G06V 10/145*    (2022.01)
*G06V 40/13*    (2022.01)
(52) U.S. Cl.
CPC ........ *G06V 40/1318* (2022.01); *G06V 10/145* (2022.01)

(58) Field of Classification Search
CPC ............. G06V 40/1318; G06V 10/145; G02B 27/4277; G04G 21/06
(Continued)

(56) References Cited

U.S. PATENT DOCUMENTS

2006/0197243 A1* 9/2006 Ellenson .......... B29D 11/00663
264/1.24
2009/0159786 A1    6/2009 Yang et al.
(Continued)

FOREIGN PATENT DOCUMENTS

CN    101894258 A    11/2010
CN    111222497 A    6/2020
(Continued)

OTHER PUBLICATIONS

International Search Report and Written Opinion for International Application No. PCT/SE2021/050958 mailed Dec. 20, 2021.
(Continued)

*Primary Examiner* — Abdul-Samad A Adediran
(74) *Attorney, Agent, or Firm* — RMCK Law Group, PLC

(57) ABSTRACT

The present invention relates to a biometric imaging arrangement comprising: an image sensor comprising a detector pixel array configured to detect infrared radiation transmitted from an object for capturing an image, a waveguide structure arranged on the image sensor to cover the detector pixel array, the waveguide structure comprising optical decoupling areas configured to orthogonally redirect infrared light received from a side of the waveguide structure towards the object when being placed for imaging.

17 Claims, 8 Drawing Sheets

(58) Field of Classification Search
USPC .......................................................... 264/1.24
See application file for complete search history.

(56) References Cited

U.S. PATENT DOCUMENTS

| | | | |
|---|---|---|---|
| 2016/0283773 A1* | 9/2016 | Popovich | G02B 27/4277 |
| 2016/0327739 A1 | 11/2016 | Nakamura et al. | |
| 2017/0010407 A1 | 1/2017 | Huang et al. | |
| 2018/0293423 A1 | 10/2018 | Huang | |
| 2018/0373945 A1 | 12/2018 | Wu et al. | |
| 2020/0033815 A1* | 1/2020 | Bushnell | G04G 21/06 |
| 2020/0089927 A1 | 3/2020 | Wu | |
| 2020/0184246 A1* | 6/2020 | Fan | G06V 40/1318 |

FOREIGN PATENT DOCUMENTS

| | | |
|---|---|---|
| WO | 03063065 A1 | 7/2003 |
| WO | 2020015761 A1 | 1/2020 |
| WO | 2020057696 A1 | 3/2020 |
| WO | 2021036586 A1 | 3/2021 |

OTHER PUBLICATIONS

Swedish Search Report for SE Application No. 2051141-6 mailed May 28, 2021.

* cited by examiner

BIOMETRIC IMAGING ARRANGEMENT FOR INFRARED IMAGING COMPRISING A WAVEGUIDE FORMED ON AN IMAGE SENSOR

CROSS-REFERENCE TO RELATED APPLICATIONS

This application is a 371 U.S. National Stage of International Application No. PCT/SE2021/050958, filed Sep. 29, 2021, which claims priority to Swedish Patent Application No. 2051141-6, filed Oct. 1, 2020. The disclosures of each of the above applications are incorporated herein by reference in their entirety.

FIELD OF THE INVENTION

The present invention relates to a biometric imaging arrangement, to an electronic device, and to a method for manufacturing a biometric imaging arrangement.

BACKGROUND

Biometric systems are widely used as means for increasing the convenience and security of personal electronic devices, such as mobile phones etc. Fingerprint sensing systems, in particular, are now included in a large proportion of all newly released consumer electronic devices, such as mobile phones.

Optical fingerprint sensors have been known for some time and may be a feasible alternative to e.g. capacitive fingerprint sensors in certain applications. Optical fingerprint sensors may for example be based on the pinhole imaging principle and/or may employ micro-channels, i.e. collimators or microlenses to focus incoming light onto an image sensor.

It has recently been of interest to arrange optical fingerprint sensors under the display of electronic devices. For optical fingerprint sensor it is important to provide sufficient illumination to the finger when capturing an image of the finger located on the display.

To avoid adding further light sources to the already cramped space under the display, the light from the display itself may be used as a light source. However, this can in some situations be experienced as disturbing, for example in a dark room where the light may be visible when it leaks out from the display.

Accordingly, there is a desire for biometric sensors that provides for less disturbing user interference and that can be assembled under the display of an electronic device.

SUMMARY

In view of above-mentioned and other drawbacks of the prior art, it is an object of the present invention to provide a biometric imaging arrangement with improved user experience.

According to a first aspect of the invention, there is provided a biometric imaging arrangement comprising: an image sensor comprising a detector pixel array configured to detect infrared radiation transmitted from an object for capturing an image, a waveguide structure arranged on the image sensor to cover the detector pixel array, the waveguide structure comprising optical decoupling areas configured to orthogonally redirect infrared light received from a side of the waveguide structure towards the object when the object being placed for imaging.

The present invention is based on the realization to use infrared light for illuminating the finger and to acquire infrared images of the object. This provides for using illumination that is invisible to the human eye. Further, the inventors realized to use a waveguide structure to guide infrared light to the object and that is arranged on the image sensor, i.e. the waveguide structure is not arranged on the side or detached of the image sensor. In this way, assembly of the biometric imaging arrangement can be made at reasonably low cost even in the cramped space often surrounding biometric sensors. Further, the inventors realized to design the waveguide structure to orthogonally redirect infrared light, thus, the infrared light that is used for illuminating the object can be injected from the side, and subsequently be orthogonally redirected towards the object. This further provides for being able to assemble the biometric imaging arrangement in a traditional way, for example in the often cramped space under the display of an electronic device.

Further, by means of the present invention, the waveguide structure is arranged on the image sensor, i.e. it is located close to the image plane of the fingerprint on the image sensor. Thus, the decoupling of the light transmitted for illuminating the finger is made close to the image plane which advantageously provides for illuminating the right place of the finger. This is at least partly due to that optics arranged between the image sensor and the finger that creates an image on the image sensor, also creates an image of the image sensor on the finger, thereby, by providing illumination from near the image plane, the correct parts of the finger are illuminated. The correct parts of the finger being the parts of the finger that the image sensor "sees", i.e. that parts that are projected onto the image sensor through the optical components of the optical stack over the image sensor.

The optical decoupling areas may be configured in various ways, but with the purpose of redirecting light received from the side of the waveguide structure orthogonally away from the waveguide and the image sensor pixel array towards the object to be illuminated. The orthogonal redirection may be considered approximately 90 degrees from the axis of the incoming light guided by the waveguide structure. The waveguide is arranged to receive light at its sides and guide the light through optical coupling to the optical decoupling areas. The waveguide is configured to guide infrared light.

The waveguide may guide the infrared light through total internal reflection. The optical decoupling areas may thus be configured to decouple the infrared light from the total internal reflection guiding and orthogonally out from the waveguide structure, in a direction orthogonal from a main plane of the waveguide structure having its main extension in the main plane.

Infrared light is herein understood to include light of wavelengths in the range covering "near infrared" to and including "far infrared" light. Thus, infrared light is herein understood to be light of wavelengths of approximately 700 nanometers (approximately 430 THz) to approximately 1 millimeter (300 GHz). Preferably, the infrared light used for embodiments herein is in the range of approximately 900 nanometers to approximately 1 micrometer, such as in the range of 930 nm to 960 nm, or 940 nm. The infrared light may be approximately 940 nm.

The image sensor may be any suitable type of image sensor, such as a CMOS or CCD sensor connected to associated control circuitry. In one possible implementation the image sensor is a thin-film transistor (TFT) based image sensor which provides a cost-efficient solution for under display fingerprint imaging sensors. The operation and control of such image sensors for detecting infrared light can be assumed to be known and will not be discussed herein. The TFT image sensor may be a back illuminated TFT image sensor or a front illuminated TFT image sensor. The TFT image sensor may be arranged as a Hot-zone, Large Area or Full display solution. The detector pixel array may be considered a photodetector pixel array.

In embodiments, the waveguide structure may be attached directly on the image sensor. This advantageously provides for a low optical stack-up for the biometric imaging arrangement.

The waveguide structure is attached directly on the image sensor on the detector pixel array side to cover the detector pixel array.

Preferably, the waveguide structure may be manufactured directly on the image sensor. In other words, during manufacturing of the image sensor, the material for waveguide structure may be deposited directly on the image sensor to cover the detector pixel array. The provides for even further reduced size of the optical stack-up and for having the waveguide very near the image plane.

Arranging the waveguide on the image sensor, either through manufacturing it directly on the image sensor or by attaching it to the image sensor advantageously provides for having the decoupling made close to the image plane of the object, such as a fingerprint on the sensor. Consequently, the decoupled infrared light is projected at the right place on the object/finger.

The biometric imaging arrangement may be configured to be arranged under a display panel of an electronic device comprising a display and to acquire an image of the object located on an opposite side of the display panel.

In embodiments, the waveguide structure may comprise a grating pattern adapted to form the optical decoupling areas to redirect the infrared light through openings in the display and towards the object. A grating pattern may be any pattern that provides to a change in refraction index. Thus, it may be a change in material or a physical structure. For example, a grating pattern is a structure that is able to redirect the infrared light by means of e.g. splitting and/or diffraction. A grating pattern may comprise of structures made in the material of the waveguide. The grating pattern may be periodic or may comprise aperiodic patterns.

Preferably, the decoupling areas of the waveguide structure are arranged aligned with the openings in the display. The improves the ability to illuminate the object adequately for imaging.

Preferably, a dimension of the grating pattern is substantially the same as the wavelength of light exceeding the visible spectrum. This provides for efficient decoupling of light towards the object. The dimension of the gratings may be approximately the same as the wavelength of the infrared light received by the waveguide structure, emitted by the light source.

In embodiments, at least one lens may be arranged between the waveguide structure and the display panel, the lens being configured to redirect infrared light transmitted from the object onto the photodetector pixel array. Such at least one lens may be camera type lens or a microlens or an array of microlenses.

The biometric imaging arrangement may comprise an infrared light source for producing the infrared light. Such a light source is preferably arranged at the outer perimeter or edge of the image sensor or the display panel. Thus, the light source is arranged so that it does not cover the image sensor pixels. A secondary waveguide may be arranged to guide the light from the light source to the waveguide on the image sensor.

The infrared light source may be arranged adjacent to the waveguide structure.

In embodiments, the waveguide structure may be a film formed on the image sensor, the film comprising a main surface facing away from the image sensor, and at least one side surface, wherein the film is adapted to receive the infrared light at the side surface, guide the infrared light through the waveguide parallel to a main plane of the film, and orthogonally redirect the infrared light at the decoupling areas.

Such a film may be considered a thin film such as manufactured by thin film technology or nano-imprint technology. The thickness of such as film is on the order of the wavelength of the infrared light used for illuminating the object.

The at least one side surface of the film may be adapted to receive infrared light from the infrared light source. The side surface may thus be arranged or otherwise adapted or shaped to efficiently receive the infrared light.

In embodiments, the waveguide may comprise a nanoimprinted material. Such a material may for example be a polymer material with suitable optical properties. Nanoimprinting is performed for forming the decoupling areas, e.g. grating patterns or similar.

The infrared light may be narrow linewidth light. One preferred wavelength is approximately 940 nm as the sunlight is strongly attenuated at this wavelength and an IR-cut filter can be made transparent for this wavelength.

According to a second aspect of the invention, there is provided an electronic device comprising: an at least partly transparent display panel; the biometric imaging arrangement according to any one of the herein disclosed embodiments, and processing circuitry configured to: receive a signal from the biometric imaging arrangement indicative of a biometric object touching the transparent display panel, perform a biometric authentication procedure based on the detected fingerprint.

The electronic device may be e.g. a mobile device such as a mobile phone (e.g. Smart Phone), a tablet, a phablet, etc.

Further effects and features of the second aspect of the invention are largely analogous to those described above in connection with the first aspect of the invention.

According to a third aspect of the invention, there is provided a method for manufacturing a biometric imaging arrangement comprising an image sensor having a detector pixel array, the method comprising: depositing a waveguide structure material on the detector pixel array of the image sensor; and patterning the waveguide structure material to form decoupling areas configured to orthogonally redirect infrared light away from a plane of the photodetector pixel array.

In embodiments, the method may comprise producing the image sensor chip in the same production flow as the deposition and patterning of the waveguide structure material.

The decoupling areas may be created using e.g. lithography techniques or nanoimprinting.

Example techniques for producing the waveguide structure include thin film technology such as sputtering, chemical vapor deposition, physical vapor deposition, pulsed laser deposition, nanoimprinting, etc.

Example material for the waveguide structure include polymers and $SiO_2$ or $SiN_x$.

Further effects and features of the third aspect of the invention are largely analogous to those described above in connection with the first aspect and the second aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

In the present detailed description, various embodiments of the biometric imaging arrangement according to the present invention are mainly described with reference to a biometric imaging arrangement arranged under a display panel. However, it should be noted that the described imaging device also may be used in other biometric imaging applications such as in an optical fingerprint sensor located under a cover glass or the like.

Figure 1:
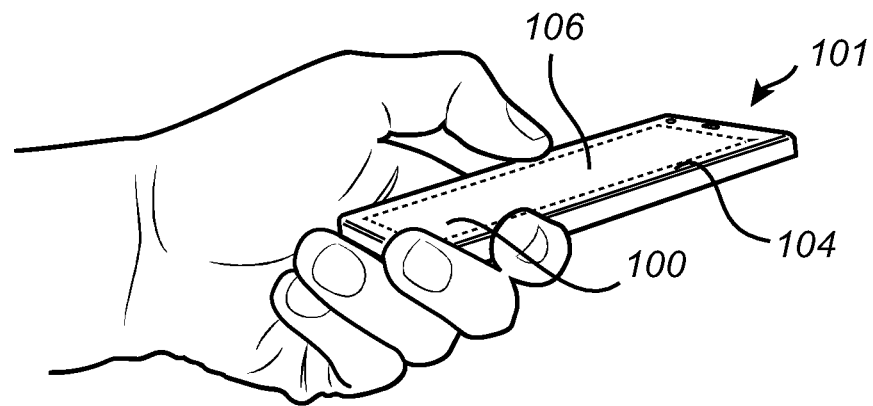
FIG. 1 schematically illustrates an example of an electronic device according to embodiments of the invention.

Turning now to the drawings and in particular to FIG. 1, there is schematically illustrated an example of an electronic device configured to apply the concept according to the present disclosure, in the form of a mobile device 101 with an integrated in-display optical biometric imaging arrangement 100 and a display panel 102 with a touch screen interface 106. The biometric imaging arrangement 100 may, for example, be used for unlocking the mobile device 101 and/or for authorizing transactions carried out using the mobile device 101, etc.

The biometric imaging arrangement 100 is here shown to be smaller than the display panel 102, but still relatively large, e.g. a large area implementation. In another advantageous implementation the optical biometric imaging arrangement 100 may be the same size as the display panel 102, i.e. a full display solution. Thus, in such case the user may place his/her finger anywhere on the display panel for biometric authentication. The optical biometric imaging arrangement 100 may in other possible implementations be smaller than the depicted optical biometric imaging arrangement, such as providing a hot-zone implementation.

Preferably and as is apparent for the skilled person, the mobile device 101 shown in FIG. 1 may further comprise a first antenna for WLAN/Wi-Fi communication, a second antenna for telecommunication communication, a microphone, a speaker, and a phone control unit. Further hardware elements are of course possibly comprised with the mobile device.

It should furthermore be noted that the invention may be applicable in relation to any other type of electronic devices comprising transparent display panels, such as a laptop, a tablet computer, etc.

Figure 2:
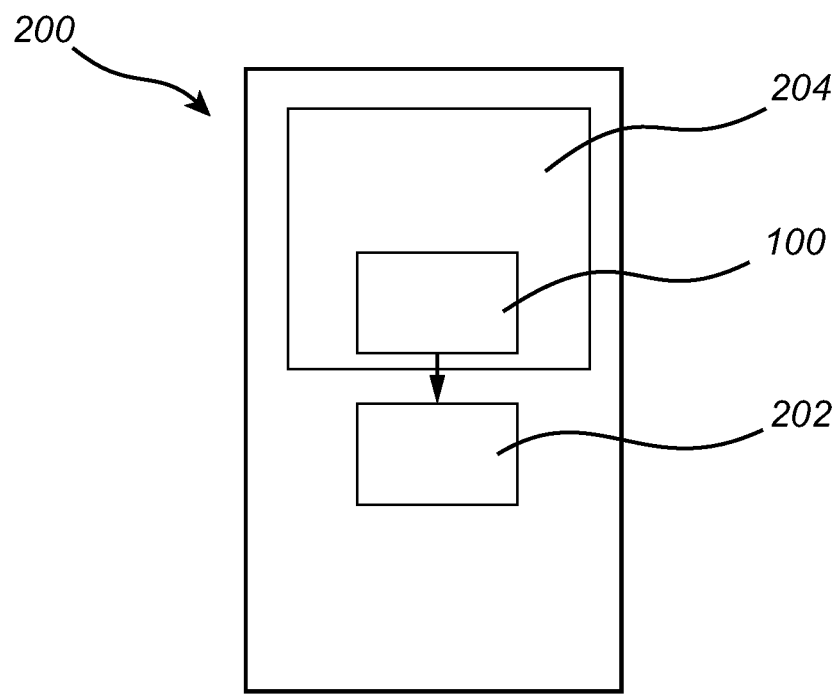
FIG. 2 is a schematic box diagram of an electronic device according to embodiments of the invention.

FIG. 2 is a schematic box diagram of an electronic device according to embodiments of the invention. The electronic device 200 comprises a transparent display panel 204 and a biometric imaging arrangement 100 conceptually illustrated to be arranged under the transparent display panel 204 according to embodiments of the invention. Furthermore, the electronic device 200 comprises processing circuitry such as control unit 202. The control unit 202 may be stand-alone control unit of the electronic device 202, e.g. a device controller. Alternatively, the control unit 202 may be comprised in the biometric imaging arrangement 100.

The control unit 202 is configured to receive a signal indicative of a detected object from the optical biometric imaging arrangement 100. The received signal may comprise image data.

Based on the received signal the control unit 202 is arranged to detect a fingerprint. Based on the detected fingerprint the control unit 202 is configured to perform a fingerprint authentication procedure. Such fingerprint authentication procedures are considered per se known to the skilled person and will not be described further herein.

Figure 3A:
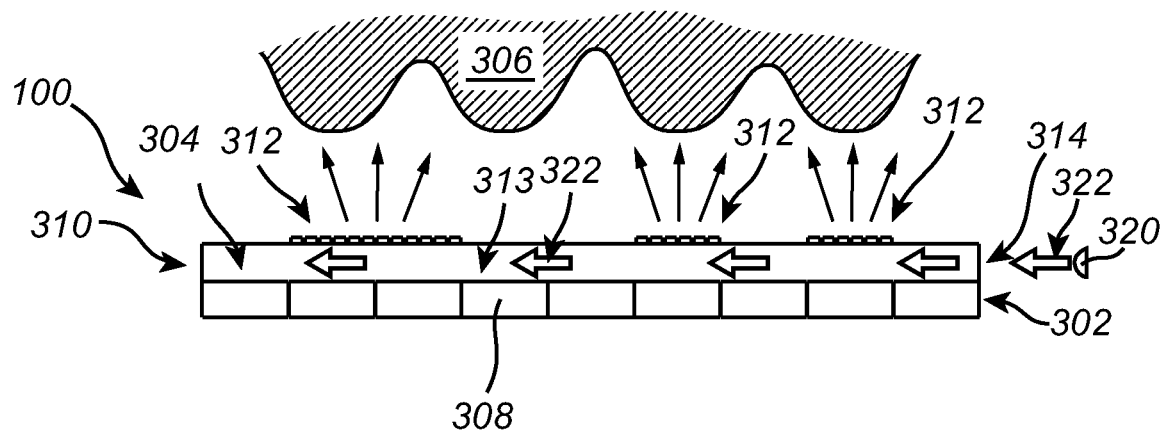
FIG. 3A is a schematically cross-section of a biometric imaging arrangement according to embodiments of the invention.
Figure 3B:
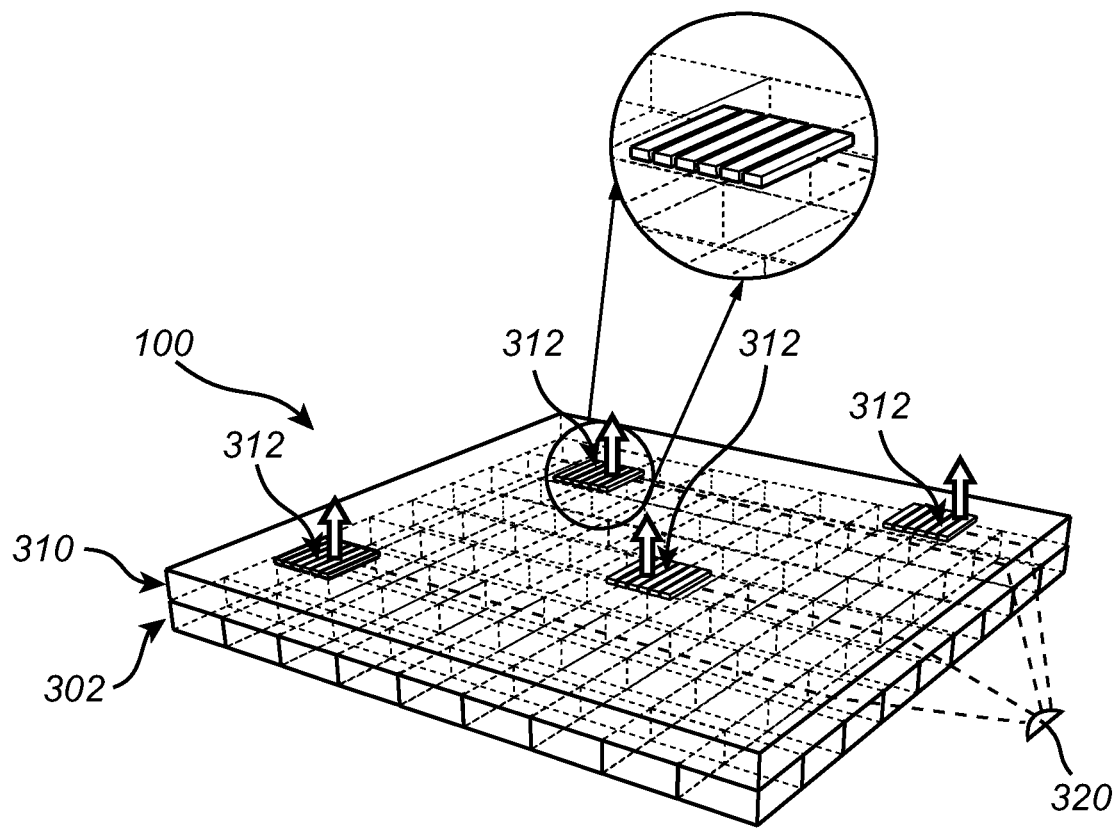
FIG. 3B schematically illustrates a biometric imaging arrangement according to embodiments of the invention.

FIG. 3A is a cross-section of a biometric imaging arrangement 100 according to embodiments of the invention and FIG. 3B is a perspective view of the biometric imaging arrangement 100. The biometric imaging arrangement 100 comprises an image sensor 302 comprising a detector pixel array 304 configured to detect infrared radiation transmitted from an object 306 for capturing an image. The detector pixel array 304 comprises a set of photodetectors 308 of which one is numbered. Here the pixels 308 are considered photodetector pixels configured to detect light in the infrared wavelength range.

Each pixel 308 is an individually controllable photodetector arranged to detect an amount of incoming light and to generate an electric signal indicative of the light received by the detector. The image sensor 302 may be any suitable type of image sensor, such as a CMOS or CCD sensor connected to associated control circuitry. However, the image sensor 302 may in some implementations be a thin-film transistor (TFT) based image sensor which provides a cost-efficient solution. The operation and control of such an image sensor can be assumed to be known and will not be discussed herein.

The biometric imaging arrangement 100 comprises a waveguide structure 310 arranged on the image sensor 302 to cover the photodetector pixel array 304.

The waveguide structure 310 comprises optical decoupling areas 312 configured to orthogonally redirect infrared light radiation received from a side 314 of the waveguide structure 310 towards the object 306, i.e. towards the location where the object is placed for imaging.

The waveguide structure 310 may be attached directly on the image sensor 302 by e.g. glue or a cladding layer. However, preferably the waveguide structure 310 is manufactured directly on the image sensor 302 as will be described in further detail below. The waveguide structure 310 is attached to the image sensor on the detector pixel array side 313, e.g. on the pixel array 304, facing towards the object 306, or when the image sensor is arranged under a display panel, facing the display panel.

With regards to infrared imaging, an infrared light source 320 is arranged to provide infrared light 322 to the waveguide structure 310. The infrared light 322 is input at the edge 314 of the waveguide structure 310 and is guided by the material of the waveguide 310 along the plane of the photodetector pixel array 304 on which the planar waveguide structure 310 is located. Infrared light emitted by the light source 320 into the waveguide structure 310 is guided by the waveguide 310 towards the decoupling areas 312. At the decoupling areas 312, the light beams 322 are caused to at least partly decouple out from the waveguide structure 310 and travel orthogonally from the main plane of the waveguide structure 310 towards the object 306. Thus, the waveguide structure 310 comprising the decoupling areas 312 advantageously provides for an orthogonal redirecting of the light beams 322 which enables for receiving the light beams from the side 314, and still provide for efficient illumination of the object 306. For example, the light source 320 may be placed adjacent to the waveguide structure and therefore also adjacent to the image sensor 302.

The decoupling areas 312 may be formed in various ways, with the objective to orthogonally redirect light guided by the waveguide towards the object that is illuminated. Orthogonally is here with regards to the main plane of the waveguide in which the light is guided within the waveguide. Some spread of the light when it is decoupled out from the waveguide towards the object is conceivable. This spread will provide some light that is decoupled at an angle that deviates from 90 degrees with respect to the plane of the waveguide. Thus, a deviation from orthogonal, i.e. 90 degrees is allowed. However, at least a portion of the decoupled light is transmitted orthogonally from the plane of the waveguide in which the light 322 is being guided. A main portion of the decoupled light is redirected towards the object. In other words, the decoupling areas are adapted to redirect at least a portion of the light guided by the waveguide towards the location where an object is intended to be located for imaging. It may be considered that the optical axis of the redirected light is orthogonal to the main plane of the waveguide structure.

Figure 3C:
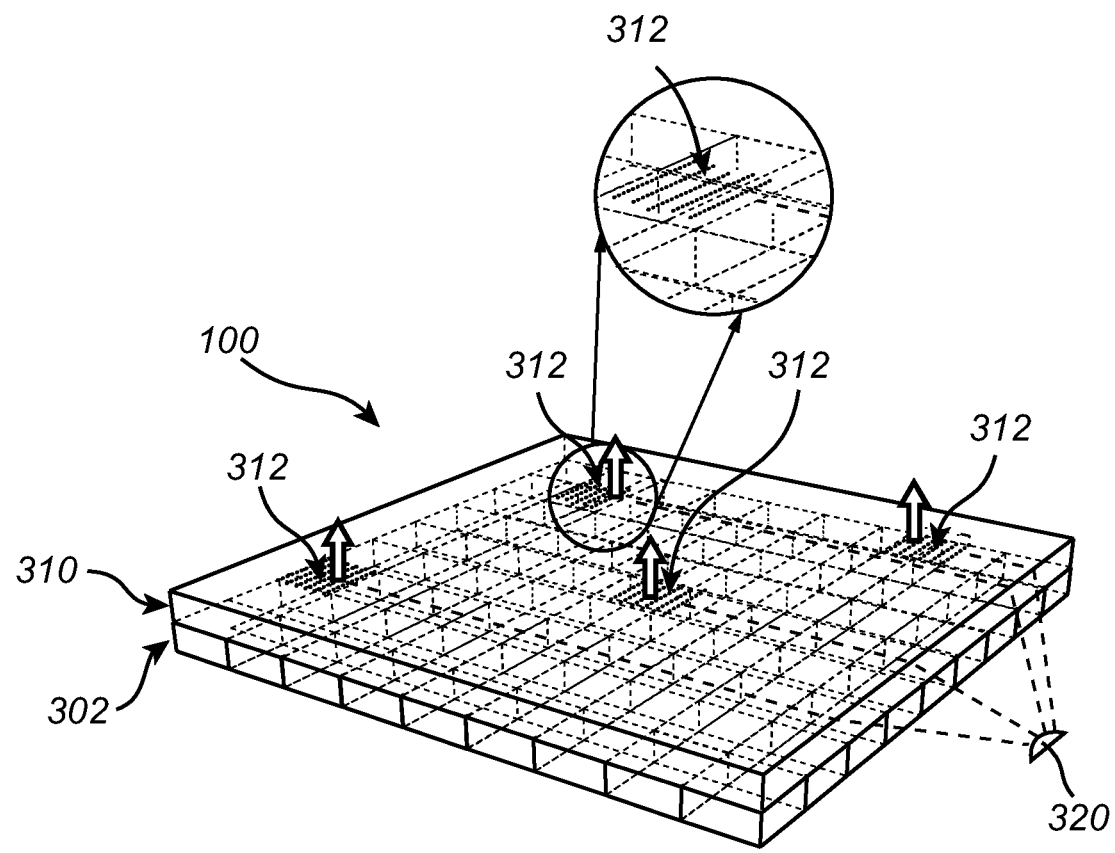
FIG. 3C schematically illustrates a biometric imaging arrangement according to embodiments of the invention.

In FIG. 3B, the decoupling areas 312 are shown to include linear gratings. It is understood that other types of structures are possible, such as point lattice structures, e.g. as shown in FIG. 3C where the decoupling areas 312 are illustrated as arrays of points or dots in the waveguide structure.

Generally, light may travel in a waveguide through total internal reflection. As long as the incidence angle of the light inside the waveguide is less that a critical angle Δ=arcsine (n2/n1) based on the refractive indices of the waveguide (n1) and the surrounding medium (n2), the light will be reflected without loss inside the waveguide. However, with the above described gratings, the angle of incidence will be altered at the location of the microlenses, thereby leading to a lossy reflection and decoupling of light out from the grating towards the object 304. For this to occur efficiently, the mode of the light at least partly penetrates the grating, One possible way of forming the decoupling areas 312 is by means of grating patterns. A grating pattern generally provides a shift in the refraction index which causes a refraction of the incoming light. FIGS. 4A-E conceptually illustrates example grating patterns, although other grating patterns are also conceivable.

Figure 4A:
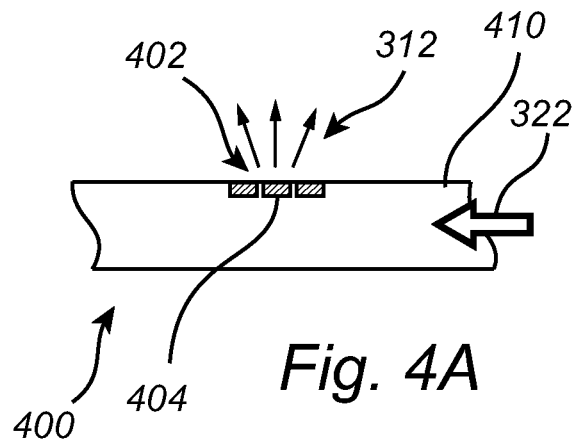
FIG. 4A conceptually illustrates an example decoupling area of the waveguide structure according to embodiments of the invention.

As conceptually illustrated in FIG. 4A, the decoupling area 312 may comprise a grating pattern 402 formed in the waveguide structure 400 by means of a different material. Structures 404 are formed in the waveguide structure 400, for example by means of providing a material having suitable optical properties in cavities or trenches formed in the waveguide material. Thus, the waveguide body material is made from a first material and the grating pattern 402 comprises a second material that is not the same as the first material. By selecting the second material according to suitable refraction index, it is possible to achieve the orthogonal redirection of an incoming light beam 322. The material of the grating should be transparent to light of the wavelength of the infrared light emitted by the light source. This provides for the wave front of the emitted infrared light to at least partly travel in the gratings to thereby enable decoupling of the light.

Figure 4B:
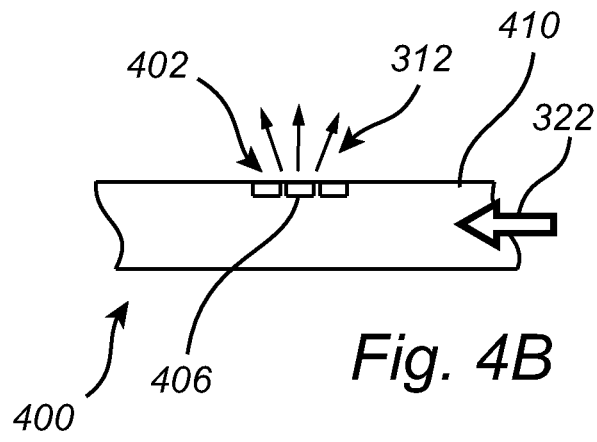
FIG. 4B conceptually illustrates an example decoupling area of the waveguide structure according to embodiments of the invention.
Figure 4C:
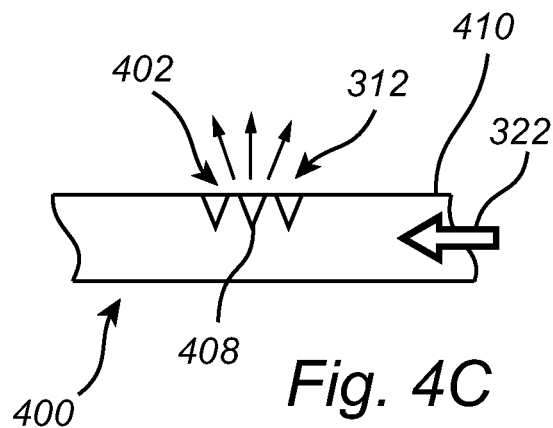
FIG. 4C conceptually illustrates an example decoupling area of the waveguide structure according to embodiments of the invention.

In FIGS. 4B-C the decoupling areas 312 comprises grating patterns 402 that are provided by means of trenches 406, 408 made in the waveguide structure upper surface 410. As conceptually illustrated, the trenches can be different cross-sectional shapes. For example, a rectangular like cross-section as the trenches 406 in FIG. 4B or a triangular like cross-section as the trenches 408 in FIG. 4C. Such trenches may be formed by using etching techniques for etching into the material of the waveguide structure.

Figure 4D:
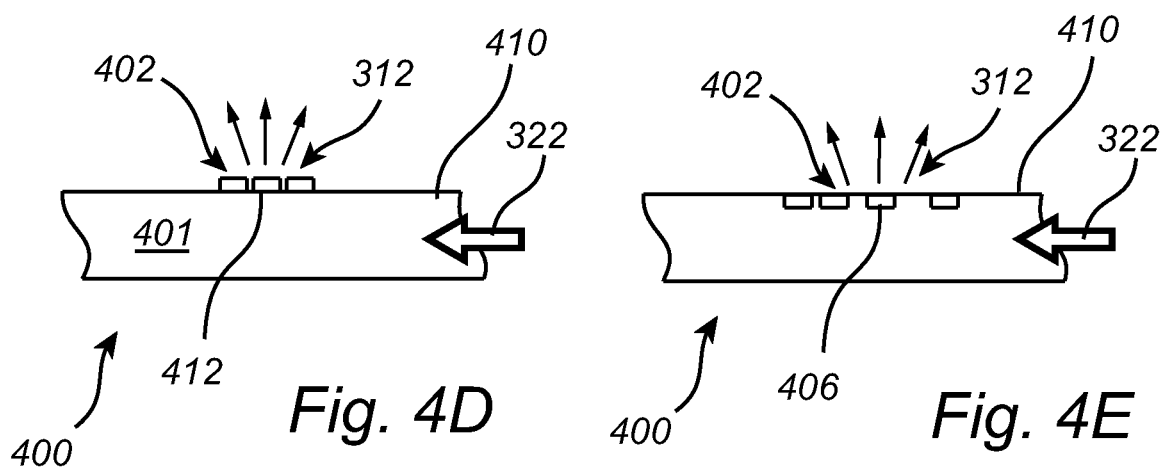
FIG. 4D conceptually illustrates an example decoupling area of the waveguide structure according to embodiments of the invention.

FIG. 4D conceptually illustrates another conceivable decoupling area 312 provided by means of a grating pattern 402. Here, the grating pattern comprises protruding structures 412 protruding out from the upper surface 410 of the waveguide structure 400. The protruding structures 412 may be made in the same material as the body 401 of the waveguide structure 400, or the protruding structures 412 may comprise a second material different from the material of the body 401 of the waveguide structure 400.

The grating patterns 402 may be periodic, thus formed in a periodic pattern with the equidistant distribution between trenches and/or cavities as conceptually illustrated in FIGS. 4A-D.

Figure 4E:
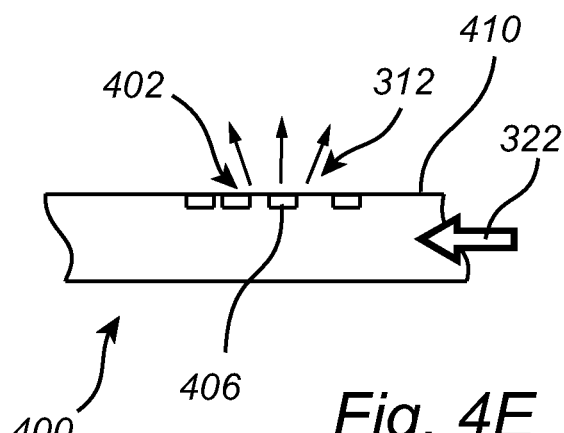
FIG. 4E conceptually illustrates an example decoupling area of the waveguide structure according to embodiments of the invention.

However, in other possible implementations, the grating patterns may be aperiodic, as is conceptually illustrated in FIG. 4E where the grating structures 406 are not equidistant distributed, i.e. the distance between grating structures 406 such as trenches are varying across the grating pattern 402.

A dimension of a grating pattern as described herein is substantially the same as the wavelength of the infrared light used for illuminating the object. This provides for efficient decoupling of light out from the waveguide structure. A dimension of the grating pattern may relate to the linewidth of the structures of the grating pattern.

Figure 5:
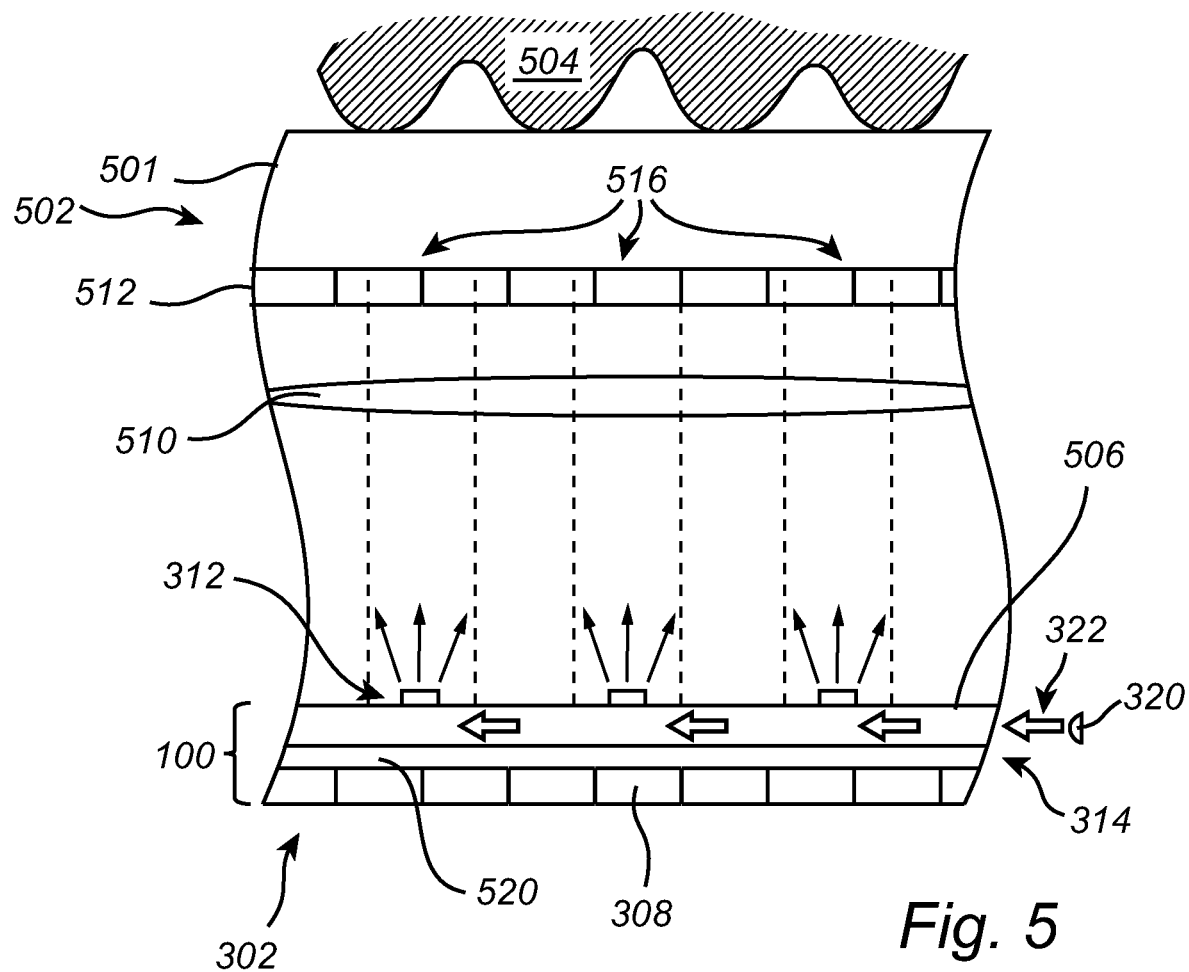
FIG. 5 schematically illustrates a biometric imaging arrangement arranged under a display panel according to embodiments of the invention.

FIG. 5 conceptually illustrates a biometric imaging arrangement 100 according to embodiments of the invention. The biometric imaging arrangement 100 is configured to be arranged under an at least partly transparent display panel 502 of an electronic device and to acquire an image of the object 504 located on an opposite side of the at least partly transparent display panel 502.

The biometric imaging arrangement 100 comprises an image sensor 302 and a waveguide structure 506 according to embodiments of the invention. The waveguide structure 506 comprises decoupling areas 312 to orthogonally redirect infrared light received from an infrared light source 320 towards the object 504. The waveguide structure 506 is attached to the detector pixel array side 313 facing towards display panel 502. The waveguide structure 506 is arranged somewhere between the display panel and the image sensor pixel array.

The biometric arrangement 100 here further comprises at least one lens 510 arranged between the waveguide structure 506 and the display panel 502. The lens 510 being configured to redirect infrared light transmitted from the object 504 onto the photodetector pixel array of the image sensor 302. The waveguide structure 506 is arranged interleaved between the lens 510 and the display panel 502.

The at least partly transparent display panel 502 may comprise a color controllable light source 512 in the form of a display arranged under a cover glass 501. Various types of displays are conceivable. For example, display panels based on OLED, u-LED with any type of tri-stimulus emission like RGB, CMY or others.

The decoupling areas 312 may be arranged to redirect the infrared light 320 through openings 516 in the display 512 and towards the object 504, the openings being conceptually indicated by dashed lines aligned with the decoupling areas 312. Thus, the light sources of the display 512 may not be completely dense.

Similarly, there are suitable openings or optical paths past the color controllable light source 512 so that the light beams being transmitted from the object 504 can reach the image sensor 302. For example, the color controllable light source may be a display with the light sources not being completely dense. In other words, this allows the reflected light from the object to reach the sensor as well as infrared light from the decoupling areas 312 to reach the object 504.

The decoupling areas 312 of the waveguide structure 506 are arranged to be aligned with the openings 516 in the display 512.

The image sensor 302 may be covered by a cladding layer 520 for protection of the photodetector pixels 308.

The infrared light source 320 for producing the infrared light may be arranged along an edge 314 of the image sensor and the waveguide structure. It is also conceivable that a further waveguide guides the light from a more remote location of the biometric imaging arrangement to the side of the waveguide structure.

The waveguide structure 506 with the decoupling areas 312 is arranged on the image sensor 302, i.e. it is located close to the image plane of the fingerprint on the image sensor. The optics 510 arranged between the image sensor 302 and the finger 504 creates an image on the image sensor, but in a similar manner the optics 510 also creates an image of the image sensor on the finger 504. By providing illumination from near the image plane, i.e. as provided by the decoupling of light from the decoupling areas 312, the "correct" parts of the finger 504 are illuminated. The correct parts of the finger being the parts of the finger that the image sensor "sees", i.e. that parts that are projected onto the image sensor through the optical components such as the display panel 502 and the lens 510.

Figure 6:
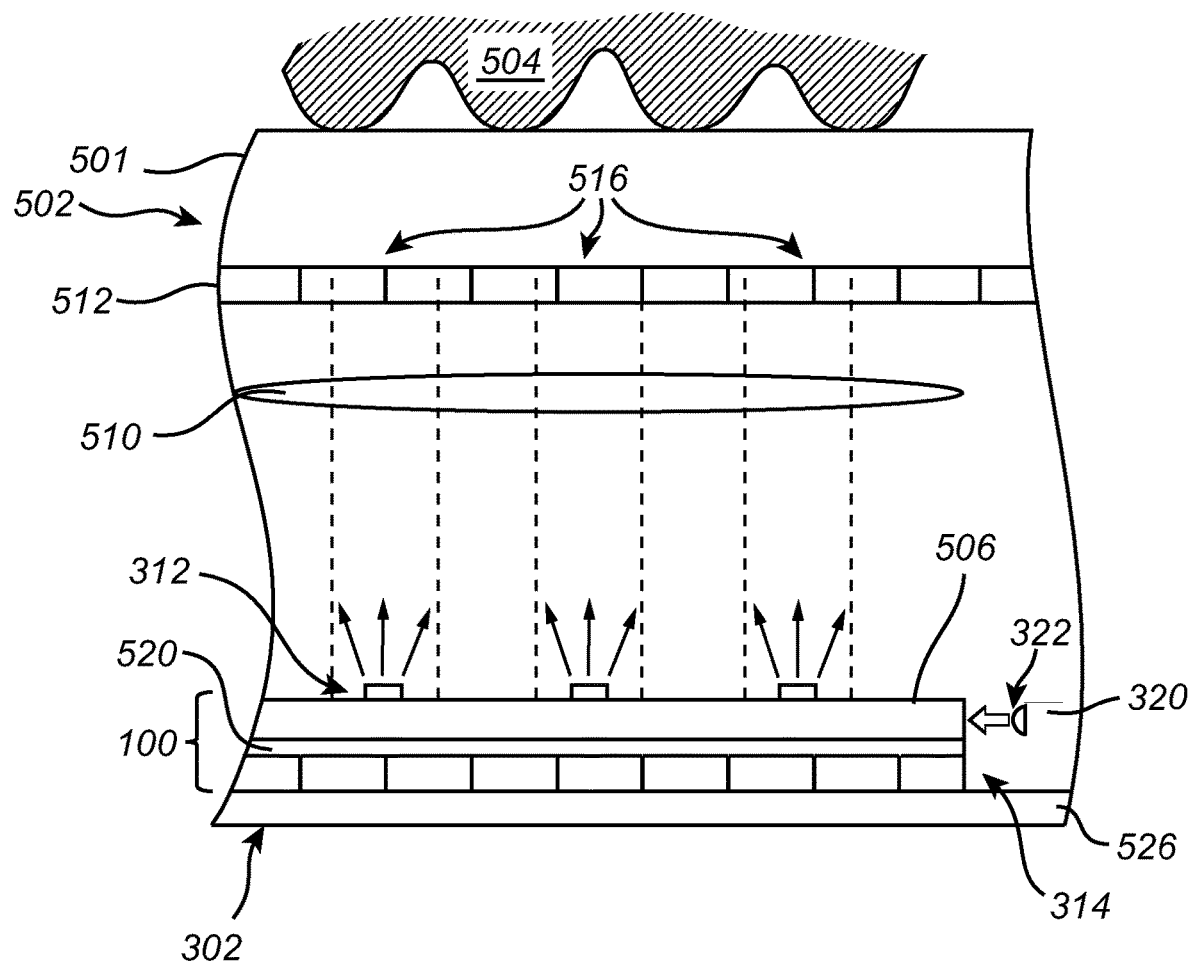
FIG. 6 schematically illustrates a biometric imaging arrangement arranged under a display panel according to embodiments of the invention.

FIG. 6 conceptually illustrates the infrared light source 320 arranged on a substrate 526 adjacent to the image sensor 302 and the waveguide structure 506 such that light may be emitted into the waveguide structure 506 from the side 314.

An infrared light source may be a light-emitting diode (LED) or a laser although other types of infrared light sources are also conceivable. The infrared light may be is narrow linewidth light. This advantageously provides for accurate tailoring IR cut filters of the biometric imaging arrangement to allow for passing of the narrow linewidth IR light.

Figure 7:
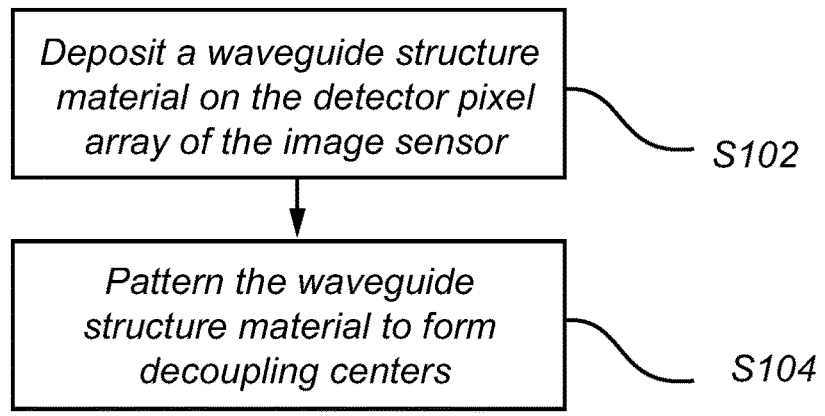
FIG. 7 is a flow-chart of a method for manufacturing a biometric imaging arrangement according to embodiments of the invention.

Example embodiments of the present invention related to manufacturing of a biometric imaging arrangement will now be described with reference to the flow-chart in FIG. 7 in conjunction with FIGS. 8A-B and FIGS. 9A-B.

In step S102, depositing a waveguide structure material on the detector pixel array of the image sensor.

Figure 8A:
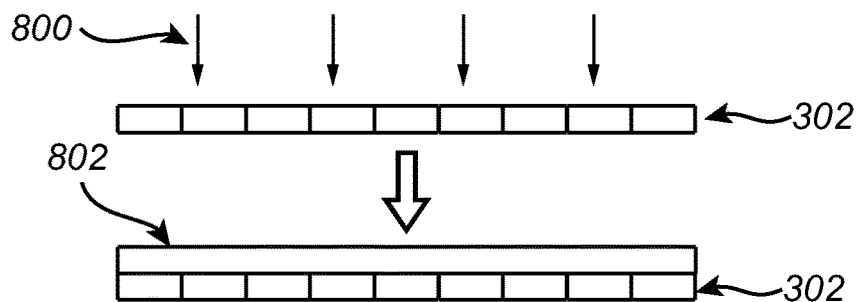
FIGS. 8A-B conceptually illustrate manufacturing steps according to embodiments of the invention.

Depositing the waveguide material may be performed by means of microfabrication technologies such as used in CMOS fabrication schemes. In such case the waveguide structure material 800, here conceptually illustrated by arrow, may be deposited as thin film 802 of e.g. $SiO_2$ or $SiN_x$ which advantageously are standard materials for a protective cover on the image sensor pixel array. Thus, as shown in FIG. 8A, a thin film 802 may be grown on the image sensor 302. The thickness of such as thin film is preferably approximately the same as the wavelength infrared light used for illumination of the object. For example, in the case of infrared light of wavelength of about 1 μm, the thickness may be about 5-20 μm. In case of infrared light of wavelength of about 1 mm to about 50 μm, the thickness may be selected from the corresponding range of about 1 mm to about 50 μm.

Figure 9A:
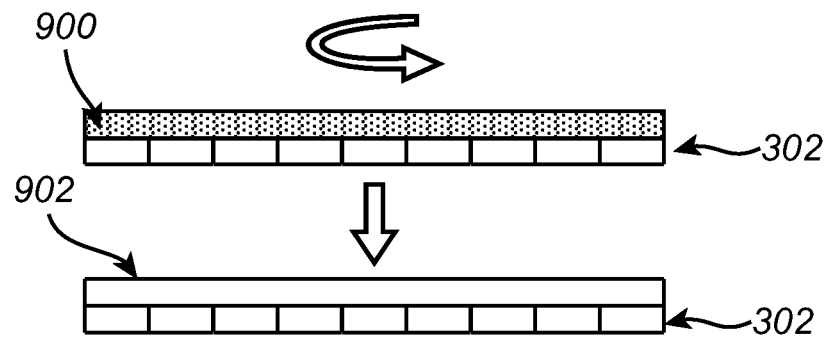
FIGS. 9A-B conceptually illustrate manufacturing steps according to embodiments of the invention.

Turning to FIG. 9A, conceptually illustrating the deposition of a polymer layer 900 on the image sensor 302 for a subsequent nanoimprint fabrication step. Deposition of a polymer may be performed by e.g. spin-coating the image sensor with the waveguide material 900 followed by curing by heat or ultraviolet light to form a solid layer 902 of waveguide material. Spin-coating is known per se and briefly including applying a liquid substance such as a polymer on a substrate and the subsequently spinning the substrate to form a homogenous layer of the polymer on the substrate. Another conceivable way to form the waveguide material layer 902 on the image sensor 302 is to use so-called roll-to-roll manufacturing in which the waveguide material in the form of a polymer film is rolled onto the image sensor 302.

In step S104, patterning the waveguide structure material to form decoupling areas 312 configured to orthogonally redirect infrared light away from a plane of the photodetector pixel array.

Figure 8B:
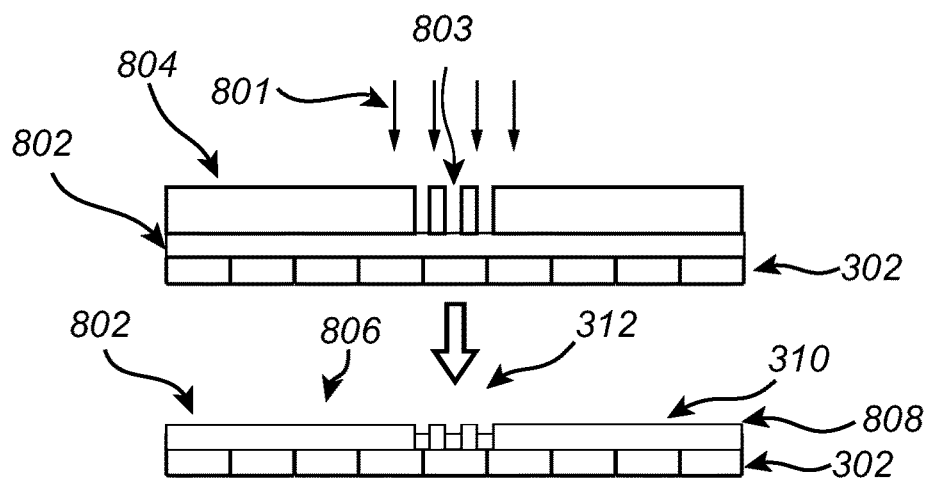

Turning to FIG. 8B, the patterning of the thin film 802 may be performed by lithography techniques such as optical lithography followed by etching. Etching techniques are per se known and may be based on bombardment of the material by e.g. plasma 801 or ions 801, or if wet etching is used by a suitable chemical. Etching is generally performed by selective removal of material through openings 803 in a template 804 that may be provided in various ways.

The template 804 may for example be a resist layer on the waveguide material. Using such techniques, i.e. electron beam or optical beam lithography, the desired pattern is written directly on the resist layer which subsequently is developed and etched through using e.g. dry- or wet-etching techniques. Thus, the template 804 is often made from a resist layer applied and cured directly on the surface, here the surface of the waveguide material. After a pattering step of the resist layer, the waveguide material is etched.

It is understood that many manufacturing techniques and variants thereof are conceivable such as variants of for example electron- or optical beam lithography for patterning the film 802. Further, it is conceivable that the template 804 is provided in other ways that as a resist layer, for example in the form of a mask.

Accordingly, the waveguide structure 310 may be made from a film formed on the image sensor 302. The film 802 comprising a main surface 806 facing away from the image sensor 302 and arranged in a main plane of the film 802 and at least one side surface 808. In use, the infrared light is received at the side surface 808, guided through the waveguide in the main plane, and redirected orthogonally at the decoupling areas 312.

Figure 9B:
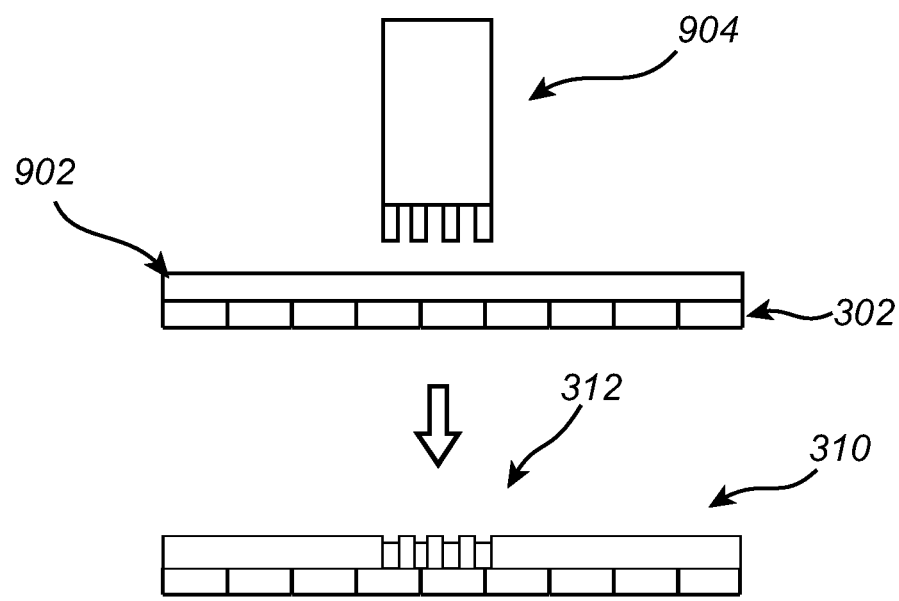

Turning to FIG. 9B, a nanoimprinting lithography step is conceptually illustrated. A mold 904 is pressed against the waveguide material 902 to form the decoupling area 312. The imprinting may include heating the waveguide material. Further, some methods known per se includes to cure the waveguide material 900 at the same time at applying the mold 904.

It is understood that nanoimprinting is known per se and many different variations to the method are conceivable and within the scope of the present application. In view of the above, in embodiments, the waveguide structure 310 comprises a nanoimprinted material 902.

With the above manufacturing techniques and material choice, it is provided to produce the image sensor chip in the same production flow as the deposition and patterning of the waveguide structure material.

A control unit may include a microprocessor, microcontroller, programmable digital signal processor or another programmable device. The control unit may also, or instead, include an application specific integrated circuit, a programmable gate array or programmable array logic, a programmable logic device, or a digital signal processor. Where the control unit includes a programmable device such as the microprocessor, microcontroller or programmable digital signal processor mentioned above, the processor may further include computer executable code that controls operation of the programmable device. It should be understood that all or some parts of the functionality provided by means of the control unit (or generally discussed as "processing circuitry") may be at least partly integrated with the optical biometric imaging arrangement.

Even though the invention has been described with reference to specific exemplifying embodiments thereof, many different alterations, modifications and the like will become apparent for those skilled in the art. Also, it should be noted that parts of the imaging device may be omitted, interchanged or arranged in various ways, the imaging device yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A biometric imaging arrangement comprising:
an image sensor comprising a detector pixel array configured to detect infrared radiation transmitted from an object for capturing an image, the detector pixel array being arranged on a first side of the image sensor,
a waveguide structure attached directly on the detector pixel array side of the image sensor to cover the detector pixel array, the waveguide structure comprising optical decoupling areas configured to orthogonally redirect infrared light received from a side of the waveguide structure towards the object when being placed for imaging,
wherein the biometric imaging arrangement is configured (i) to be arranged under a display panel of an electronic device comprising a display, and to acquire an image of the object located on an opposite side of the display panel, and
wherein the waveguide structure comprises a grating pattern adapted to form the optical decoupling areas for redirecting the infrared light through openings in the display and towards the object.

2. The biometric imaging arrangement according to claim 1, wherein the waveguide structure is a thin film covering the detector pixel array.

3. The biometric imaging arrangement according to claim 1, wherein the waveguide structure is manufactured directly on the image sensor.

4. The biometric imaging arrangement according to claim 1, wherein the decoupling areas of the waveguide structure are arranged to be aligned with the openings in the display.

5. The biometric imaging arrangement according to claim 1, wherein a dimension of the grating pattern is substantially the same as a wavelength of light exceeding the visible spectrum.

6. The biometric imaging arrangement according to claim 1, comprising at least one lens arranged between the waveguide structure and the display panel, the lens being configured to redirect infrared light transmitted from the object onto the photodetector pixel array.

7. The biometric imaging arrangement according to claim 1, comprising an infrared light source for producing the infrared light.

8. The biometric imaging arrangement according to claim 7, wherein the infrared light source is arranged adjacent to the waveguide structure.

9. The biometric imaging arrangement according to claim 1, wherein the waveguide structure is a film formed on the image sensor, the film comprising a main surface facing away from the image sensor, and at least one side surface, wherein the film is adapted to receive the infrared light at the side surface, guide the infrared light through the waveguide parallel to a main plane of the film, and orthogonally redirect the infrared light at the decoupling areas.

10. The biometric imaging arrangement according to claim 9, wherein the at least one side surface is adapted to receive infrared light from the infrared light source.

11. The biometric imaging arrangement according to claim 1, wherein the waveguide comprises a nanoimprinted material.

12. The biometric imaging arrangement according to claim 1, wherein the infrared light is narrow linewidth light.

13. An electronic device comprising:
- an at least partly transparent display panel,
- the biometric imaging arrangement according to claim 1, and
- processing circuitry configured to:
    - receive a signal from the biometric imaging arrangement indicative of a biometric object touching the transparent display panel,
    - perform a biometric authentication procedure based on the detected fingerprint.

14. The electronic device according to claim 13, wherein the electronic device is a mobile device.

15. A method for manufacturing a biometric imaging arrangement comprising an image sensor having a detector pixel array, the method comprising:
- depositing a waveguide structure material on the detector pixel array of the image sensor;
- patterning the waveguide structure material to form decoupling areas configured to orthogonally redirect infrared light away from a plane of the detector pixel array; and
- producing the image sensor in a single production flow as the deposition and patterning of the waveguide structure material.

16. The method according to claim 15, wherein depositing comprises depositing a thin film of waveguide material on the detector pixel array.

17. The method according to claim 15, wherein the waveguide structure is a thin film covering the detector pixel array.

* * * * *